United States Patent
El-Kik

(10) Patent No.: US 6,753,709 B2
(45) Date of Patent: Jun. 22, 2004

(54) DIGITAL CLOCK RATE MULTIPLIER METHOD AND APPARATUS

(75) Inventor: Tony S. El-Kik, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/185,618

(22) Filed: Jun. 28, 2002

(65) Prior Publication Data

US 2004/0000935 A1 Jan. 1, 2004

(51) Int. Cl.[7] ............................................. H03B 19/00
(52) U.S. Cl. ...................................... 327/116; 327/119
(58) Field of Search ................................ 327/116, 119, 327/122, 270, 271, 273, 276, 279; 377/47, 49, 51

(56) References Cited

U.S. PATENT DOCUMENTS

| | | | | |
|---|---|---|---|---|
| 5,614,841 A | * | 3/1997 | Marbot et al. ................. 326/52 |
| 6,107,846 A | * | 8/2000 | Shinmori ..................... 327/116 |
| 6,150,855 A | * | 11/2000 | Marbot ........................ 327/116 |
| 6,295,328 B1 | * | 9/2001 | Kim et al. ................... 375/376 |
| 6,320,436 B1 | * | 11/2001 | Fawcett et al. ............. 327/158 |
| 6,337,588 B1 | * | 1/2002 | Chen .......................... 327/122 |
| 6,351,756 B1 | * | 2/2002 | Taniyoshi ................... 708/103 |
| 6,441,659 B1 | * | 8/2002 | Demone ..................... 327/156 |

* cited by examiner

Primary Examiner—Linh M. Nguyen
(74) Attorney, Agent, or Firm—Synnestvedt & Lechner LLP

(57) ABSTRACT

A digital clock rate multiplier for multiplying the clock rate of an input signal to produce a multiplied output signal having a higher clock rate than the input signal. The digital clock rate multiplier includes a digital delay signal generator for developing first and second delay signals based on the input signal and a delayed version of the input signal, and a clock circuit for producing the multiplied output signal based at least partially on the first and second delay signals. The multiplied output signal may be used in high speed integrated circuits.

20 Claims, 3 Drawing Sheets

DIGITAL CLOCK RATE MULTIPLIER METHOD AND APPARATUS

FIELD OF THE INVENTION

The present invention relates to the field of electronics and, more particularly, to a method and apparatus for multiplying clock rates.

BACKGROUND OF THE INVENTION

High speed integrated circuits are available currently that operate at very high clock rates. A common method for producing these high clock rates involves multiplying a readily available lower speed clock signal to achieve the desired clock rate. Two well known techniques for multiplying clock signals involve using either conventional flip-flop multipliers or analog phase locked loop (PLL) multipliers.

Conventional flip-flop multipliers utilize an analog control system that incorporates resistors and capacitors. In this type of multiplier, the desired output signal, e.g., a high speed clock signal having a precise clock rate and a 50% duty cycle, is dependent on the values of the resistors and capacitors. Since high clock rates are involved, the resistor and capacitor values must be precise to achieve the desired output signal, thereby increasing component costs. In addition, resistor and capacitor values vary with environmental conditions, such as ambient temperature, thus making it difficult to maintain their precise values.

Analog PLL multipliers utilize analog components to control clock rates. These analog components are sensitive to temperature and supply voltages, which can affect the delay and slew rate of signals produced by analog PLL multipliers. In addition, integrated circuits containing analog components require a large amount of semiconductor surface area and are difficult to redesign for use with newer fabrication technologies, e.g., redesigning an analog PLL multiplier designed for fabrication using 0.2 $\mu$m fabrication technologies to be produced using 0.13 $\mu$m fabrication technologies is a very difficult and time consuming task.

Accordingly, there is a need for clock rate multiplier methods and apparatus that are not subject to the limitations associated with conventional flip-flop multipliers and analog PLL multipliers. The present invention fulfills this needs among others.

SUMMARY OF THE INVENTION

The present invention is a digital clock rate multiplier that overcomes the aforementioned problems through the use of digital circuitry, which is resistant to variation in environmental conditions and well suited for use in integrated circuits. The digital clock rate multiplier multiplies the clock rate of an input signal to produce an output signal having a higher clock rate than the input signal. The digital clock rate multiplier includes a digital delay signal generator for developing first and second delay signals based on the input signal and a delayed version of the input signal, and a clock circuit for producing the output signal based at least partially on the first and second delay signals.

The digital delay signal generator develops a delayed output signal from an input signal for use in developing the first and second delay signals. Preferably, the delayed output signal is created by producing a plurality of delayed version of the input signal, enabling a counter for a predetermined period of the input signal, counting specified edges (e.g., rising edges) of the delayed version of the input signal when the counter is enabled, and selecting one of the delayed versions as the delayed output signal based on the number of edges counted.

One aspect of the present invention is a method for multiplying an input signal. The method includes digitally generating a first delay signal and a second delay signal based on the input signal, generating a first clock signal based on the first delay signal, generating a second clock signal based on the second delay signal, and combining the first and second clock signals to produce a multiplied output signal.

Another aspect of the invention is a digital multiplier for multiplying an input signal. The digital multiplier includes a digital delay signal generator for generating a first delay signal and a second delay signal based on the input signal, and a clock circuit for producing a multiplied output signal based at least partially on the first and second delay signals.

Another aspect of the invention is a digital delay circuit for delaying an input signal. The digital delay circuit includes one or more delay elements for delaying the input signal; a first multiplexer for receiving the input signal as delayed by each of the delay elements; a second multiplexer for receiving at least a portion of the input signals as delayed by each of the delay elements; a counter enabled during a first period of the input signal for controlling the first multiplexer and for counting specified edges of delayed versions of the input signal passed by the first multiplexer; and a divider coupled between the counter and the second multiplexer for dividing the count signal, thereby configuring the second multiplexer to pass the input signal delayed by a second period of the input signal to produce a delayed clock signal.

Another aspect of the invention is a method for delaying an input signal. The method includes producing a plurality of delayed versions of the input signal, enabling a counter for a period of the input signal, counting specified edges of the plurality of delayed version when the counter is enabled, and selecting a delayed output signal from the plurality of delayed versions based on the number of specified edges counted.

DETAILED DESCRIPTION OF THE INVENTION

Figure 1:
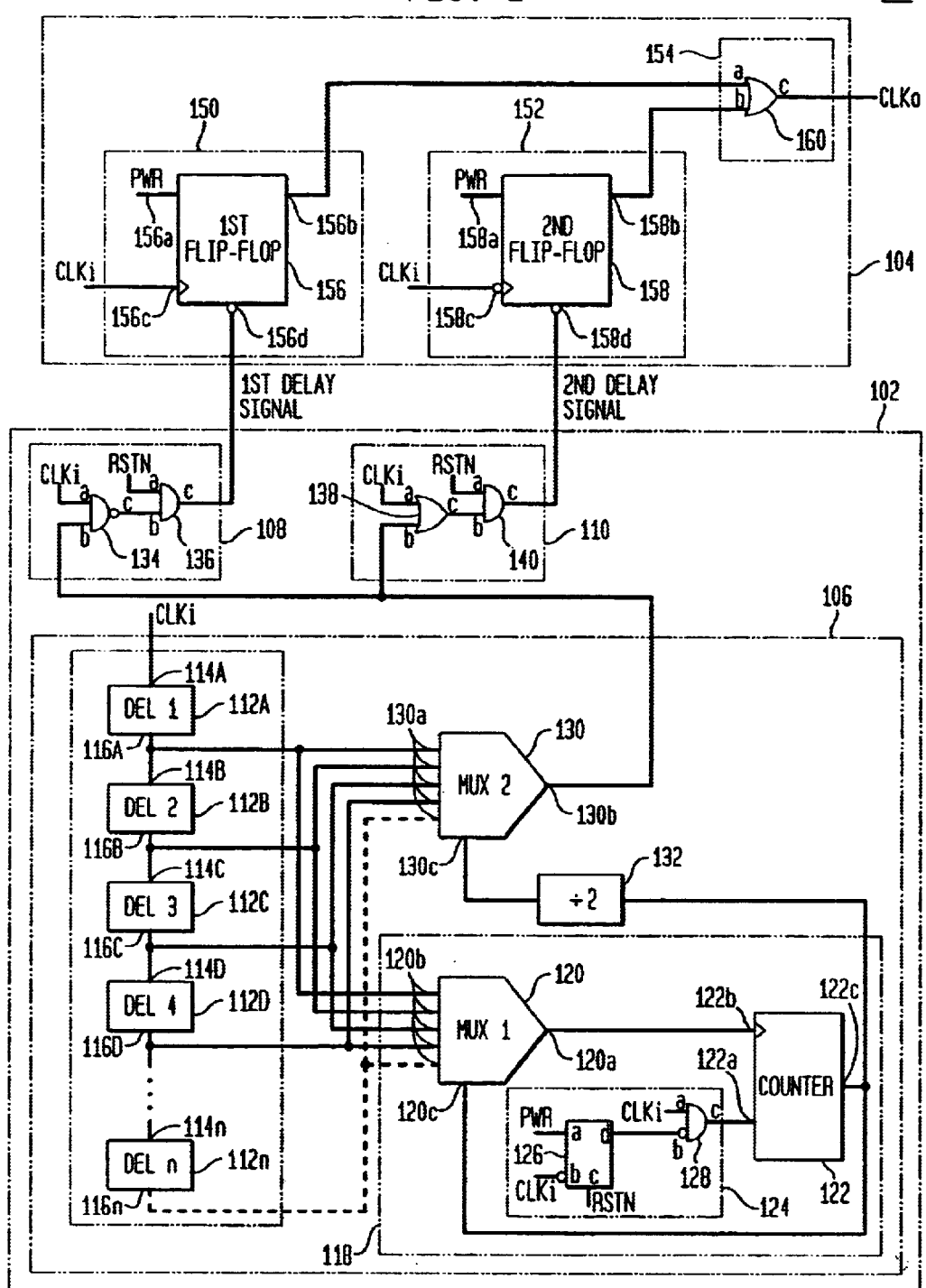
FIG. 1 is a circuit diagram of a digital clock rate multiplier in accordance with the present invention.

FIG. 1 depicts a preferred digital clock rate multiplier (DCRM) 100 for multiplying an input clock signal (CLKi) to produce a multiplied output clock signal (CLKo) in accordance with the present invention. In a general overview, a digital delay signal generator 102 generates first and second delay signals based on CLKi and a delayed version of CLKi. Using the first and second delay signals, clock circuit 104 produces CLKo, which, preferably, has twice the clock rate of CLKi and a 50% duty cycle. The DCRM 100 is particularly well suited, although not exclusively so, for use in high speed integrated circuits to multiply the clock rate of an input clock signal. The DCRM 100 will now be described in detail with reference to FIG. 1. Following the detailed description of the DCRM 100, the operation of the DCRM 100 will be described using the timing diagram of FIG. 2.

The digital delay signal generator 102 generates the first and second delay signals used by the clock circuit 104 to produce CLKo. In the illustrated embodiment, the digital delay signal generator 102 includes a delay circuit 106 for producing a delayed version of CLKi, a first delay logic circuit 108 for producing the first delay signal, and a second delay logic circuit 110 for producing the second delay signal.

The delay circuit 106 produces the delayed version of CLKi used to generate the first and second delay signals. In the illustrated embodiment, the delay circuit 106 includes a plurality of delay elements 112A-n having associated delay periods, a counting circuit 118 (including a first multiplexer 120), and a second multiplexer 130. The delay elements 112A-n are coupled in series to receive CLKi and produce delayed versions of CLKi. Each delay element 112A-n has an input terminal 114A-n for receiving a signal and an output terminal 116A-n for passing a delayed version of the signal. A first delay element 112A has an input terminal 114A for receiving CLKi and produces a first delayed version of CLKi at an output terminal 116A. The output terminal 116A of the first delay element 112A is connected to an input terminal 114B of a second delay element 112B, which produces another delayed version of CLKi that is delayed by the delay periods of two delay element, i.e., the first and second delay elements 112A, B. Since the delay elements 112A-n are connected in series, each successive delay element 112A-n produces a delayed version of CLKi that is delayed by its delay period and the delay periods of all preceding delay elements 112A-n. In a preferred embodiment, the total delay introduced by the plurality of delay elements is at least about one-half the period of CLKi.

The counting circuit 118 determines the number of delay periods within a predetermined period of CLKi, e.g., one-half the period of CLKi. In the illustrated embodiment, the counting circuit 118 includes first multiplexer 120, a counter 122, and a counter enable circuit 124. The counter 122 is a conventional counter having an enable terminal 122a coupled to the enable circuit 124, an edge detection terminal 122b (preferably, for detecting rising edges) coupled to an output terminal 120a of the first multiplexer 120, and output terminals 122c for producing a count of the number of specific edges, e.g., rising edges, received at the edge detection terminal 122b since the last reset of the counter 122. It is well known that the output terminals 122c of the counter 122 represent one or more terminals for presenting the count, e.g., a six bit counter has 6 output terminals 122c for presenting a binary representation of the count. When the counter 122 is reset, e.g., by supplying a low value to the enable terminal 122a, the counter 122 produces a zero count at its output terminals 122c. After reset, the counter 122 is enabled for the predetermined period of CLKi on the next rising edge of CLKi. During the predetermined period, the enabled counter 122 increments the count at the output terminals 122c by one every time a specified edge is received at the edge detection terminal 122b.

The enable circuit 124 resets and enables the counter 122 for the predetermined period of CLKi, e.g., one-half period. In the illustrated embodiment, the enable circuit 124 includes a flip-flop 126 and an AND logic gate 128. The flip-flop 126 has an input terminal 126a for receiving a power signal, i.e., a high value, a set terminal 126b for receiving CLKi (preferably set on falling edges of CLKi), a reset terminal 126c for receiving a reset signal (RSTN), and an output terminal 126d. During reset, e.g., when RSTN is low, the output terminal 126d of the flip-flop 126 is set to low. The output terminal 126b remains low until a falling edge of CLKi is received at the flip-flop 126, which causes the output terminal 126d to present the high value from the input terminal 126a. The AND gate 128 is a conventional logic circuit. The AND gate 128 has a non-inverting input terminal 128a for receiving CLKi and an inverting input terminal 128b coupled to the output terminal 126d of the flip-flop 126. At reset, the flip-flop 126 produces a low value at its output 126d. Thereafter, when CLKi goes high, a high value is produced at an output terminal 128c of the AND gate 128 to enable the counter 122. When a falling edge is received at the flip-flop 126, e.g., after one-half period of CLKi, the output terminal 126d is set high, thereby producing a low value at the output of the AND gate 128 to disable the counter 122. The counter 122 remains disabled until the next reset of DCRM 100.

The first multiplexer 120 has a plurality of input terminals 120b for receiving the delayed versions of the CLKi from the delay elements 112A-n, an output terminal 120a for passing one of the delayed versions of CLKi, and a control terminal 120c coupled to the output terminal 122c of the counter 122, which selects the delayed version of CLKi passed to the output terminal 120a. After reset, when the counter 122 is enabled, the counter 122 instructs the first multiplexer 120 to pass a first delayed version of CLKi, i.e., CLKi delayed by the first delay element 122a. The first delayed version is passed through the first multiplexer 120 to the counter 122, which counts the rising edge of the first delayed version of CLKi and increments the count at the output terminals 122c by one. The counter 122 then instructs the first multiplexer 120 (i.e., through the incremented count) to pass a second delayed version of CLKi, i.e., CLKi delayed by the first delay element 112A and the second delay element 112B. The counter 122 continues counting rising edges of delayed versions of CLKi and incrementing the count at the output terminals 122c until the counter 122 is disabled. The second multiplexer 130 has a plurality of input terminals 130a for receiving the delayed versions of the CLKi from the plurality of delay elements 112A-n, an output terminal 130b for passing one of the delayed versions of CLKi, and a control terminal 130c to select the delayed version of CLKi to pass to the output terminal 130b. The control terminal 130c is coupled to the output terminal 122c of the counter 122 through a divider 132, preferably, a divide by two function. After reset, when the counter 122 is enabled, the counter 122 instructs the second multiplexer 130, through the divider 132, to pass the first delayed version of CLKi. The first delayed version is passed through the second multiplexer 130 to the first and second delay logic circuits 108, 110 for use in developing the first and second delay signals, respectively. In the preferred embodiment, the counter 122, through the divider 132, increments the second multiplexer 130 by one to select the next delayed version of CLKi after every 2 counts generated by the counter 122. In the preferred embodiment, the final count divided by two results in a delayed version of CLKi at the output of the second multiplexer 130 that is delayed by one-quarter period of CLKi.

In one embodiment, e.g., where the counter 122 is a six bit counter having six output terminals 122c for presenting a binary representation of the count, the function of the divider 132, e.g., to divide the count by two, is achieved by controlling the first multiplexer 120 with the terminals associated with the all six bits of the counter 122 and controlling the second multiplexer 130 with the terminals associated with the five most significant bits of the counter 122. In this embodiment, all six output terminals 122c are coupled to the first multiplexer 120, thereby incrementing the first multiplexer 120 on every count of the counter 122. On the other hand, for the second multiplexer 130, only the five output terminals 122c associated with the most significant bits of the count are coupled to the second multiplexer 130, thereby incrementing the second multiplexer 130 on only every other count. In addition, since the second multiplexer 130 is incremented on only every other count of the counter 122, the second multiplexer 130 need only be connected to half the delay elements 112A-n to which the first multiplexer 120 is connected.

In an alternative embodiment of the delay circuit 106, where the period of CLKi is known, a predetermined delayed version of CLKi can be supplied directly to the first and second delay logic circuits 108, 110. If the frequency of CLKi is known, the amount of delay required to delay CLKi by a predetermined amount, e.g., a quarter-period of CLKi, can be calculated in a well known manner. One or more delay elements 112A-n can then be used to introduce delay to CLKi, and the signal as delayed by these delay elements 112A-n can be supplied directly to the first and second delay circuits 108, 110.

The first delay logic circuit 108 produces a first delay signal based on CLKi and the delayed version of CLKi passed by the delay circuit 106. In a preferred embodiment, the first delay logic circuit 108 performs the additional function of resetting the first signal generator 150 in the clock circuit 104 based on RSTN. In the illustrated embodiment, the first delay logic circuit 108 includes a NAND gate 134 and an AND gate 136. The NAND gate 134 has a first input terminal 134a for receiving CLKi, a second input terminal 134b for receiving the delayed version of CLKi, and an output terminal 134c. High values at the first and second input terminals 134a, b cause the value at the output terminal 134c to be low, while a low value at either the first or second input terminals 134a, b causes the value at the output terminal 134c to go high. The AND gate 136 has a first input terminal 136a coupled to RSTN, a second input terminal 136b coupled to the output terminal 134a of the NAND gate 134, and an output terminal 134c for producing the first delay signal. High values at the first and second input terminals 136a, b cause the value at the output terminal 136c to go high, while a low value at either the first or second input terminals 136a, b causes the value at the output terminal 136c to go low.

The second delay logic 110 circuit produces a second delay signal based on CLKi and the delayed version of CLKi passed by the delay circuit 106. In a preferred embodiment, the second delay logic circuit 110 performs the additional function of resetting the second signal generator 152 in the clock circuit 104 based on RSTN. In the illustrated embodiment, the second delay logic circuit 110 includes an OR gate 138 and an AND gate 140. The OR gate 138 has a first input terminal 138a for receiving CLKi, a second input terminal 138b for receiving the delayed version of CLKi, and an output terminal 138c. A high value at either the first or second input terminals 138a, b causes the value at the output terminal 138c to be high, while a low value at both the first and second input terminals 138a, b causes the value at the output terminal 138c to go low. The AND gate 140 has a first input terminal 140a coupled to RSTN, a second input terminal 140b coupled to the output terminal 138c of the OR gate 138, and an output terminal 140c for producing the second delay signal. High values at the first and second input terminals 140a, b cause the output to go high, while a low value at either the first input terminal 140a or the second input terminal 140b causes the output to go low.

The clock circuit 104 produces CLKo based at least partially on the first and second delay signals generated by the digital delay signal generator 102. In the illustrated embodiment, the clock circuit 104 includes a first signal generator 150 for developing a first clock signal, a second signal generator 152 for developing a second clock signal, and a logic circuit 154 for combining the first and second clock signals to produce CLKo.

The first signal generator 150 develops the first clock signal, which is combined with the second clock signal at the logic circuit 154 to produce CLKo. The first clock signal is based on CLKi and the first delay signal from the first digital delay logic circuit 108. In the illustrated embodiment, the first signal generator 150 is a conventional rising edge triggered flip-flop 156, which produces rising edge signals (i.e., signals based on rising edges of CLKi). The flip-flop 156 has an input terminal 156a, output terminal 156b, set terminal 156c, and reset terminal 156d. When the flip-flop 156 is reset, e.g., by a low value received at the reset terminal 156d, the flip-flop 156 presents a low value at the output terminal 156b. After reset, when a rising edge is received at the set terminal 156c, the output terminal 156b is set to the value on the input terminal 156a. In the illustrated embodiment, the input terminal 156a receives a power signal (i.e., a high value), the set terminal 156c receives CLKi, the reset terminal 156d is coupled to the first delay logic circuit 108 to receive the first delay signal, and the output terminal 156d is coupled to a first input 154a of the logic circuit 154. Since, the input terminal 156a receives a power signal having a high value, the output terminal 156b will always present a high value after a rising edge of CLKi until the flip-flop 156 is reset by the first delay signal, unless the flip-flop 156 is being reset during the rising edge of CLKi.

The second signal generator 152 develops the second clock signal, which is combined with the first clock signal at the logic circuit 154 to produce CLKo. The second clock signal is based on CLKi and the second delay signal from the second delay logic circuit 110. In the illustrated embodiment, the second signal generator 152 is a conventional falling edge triggered flip-flop 158, which produces falling edge signals (i.e., signals based on falling edges of CLKi). The flip-flop 158 has an input terminal 158a, output terminal 158b, set terminal 158c, and reset terminal 158d. When the flip-flop 158 is reset, e.g., by a low value received at the reset terminal 158d, the flip-flop 158 presents a low value at the output terminal 158d. After reset, when a falling edge is received at the set terminal 158c, the output terminal 158b will be set to the value on the input terminal 158a. In the illustrated embodiment, the input terminal 158a receives a power signal (i.e., a high value), the set terminal 158c receives CLKi, the reset terminal 158d is coupled to the second delay logic circuit 110 to receive the second delay signal, and the output terminal 158b is coupled to a second input terminal 154b of the logic circuit 154. Since, the input terminal 158a receives a power signal having a high value, the output terminal 158b will always present a high value after a falling edge of CLKi until the flip-flop 158 is reset by the second delay signal, unless the flip-flop 158 is being reset during the falling edge of CLKi.

The logic circuit 154 combines the first clock signal and the second clock signal to produce CLKo, which is a multiplied (e.g., times 2) version of CLKi. In the illustrated embodiment, the logic circuit 154 is a conventional OR gate 160. The OR gate 160 has a first input terminal 160a coupled to the output terminal 156b of the rising edge flip-flop 156 to receive the first clock signal, a second input terminal 160b coupled to the output terminal 158b of the falling edge flip-flop 158 to receive the second clock signal, and an output terminal 160c for passing CLKo. Alternative logic circuits for use with the present invention will be readily apparent to those skilled in the art of electronics.

In an alternative embodiment of the clock circuit 104, the first and second signal generators 150, 152 are first and second inverters, respectively, for inverting the first delay signal and the second delay signal. The inverted first and second delay signals are then combined by the logic circuit 154 to produce CLKo. A DCRM in accordance with this alternative embodiment does not require flip-flops 156, 158 but may require additional components that will be apparent to those skilled in the art to achieve a CLKo suitable for use with high speed integrated circuits, e.g., a signal having sharp transitions. Alternative embodiments for manipulating and combining the first and second delay signals to obtain CLKo will be readily apparent to those skilled in the art.

Figure 2:
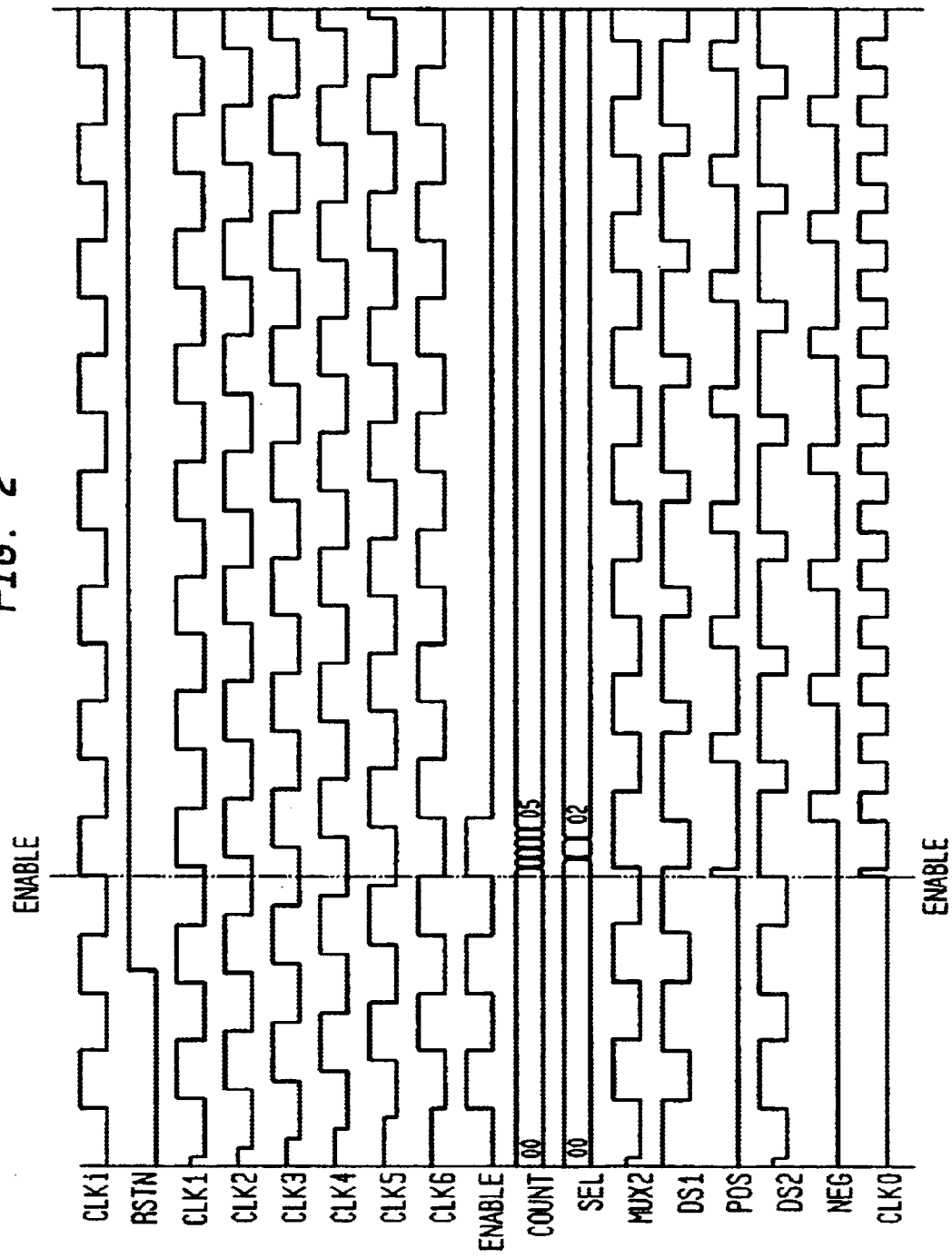
FIG. 2 is a timing diagram depicting nodes within the digital clock rate multiplier of FIG. 1.

The operation of the illustrated DCRM 100 of FIG. 1 will now be described in conjunction with the timing diagrams of FIG. 2. The timing diagram illustrates the signals involved in the development of CLKo from CLKi. In the illustrated timing diagram, CLKo has a 50% duty cycle and a clock rate that is twice the clock rate of CLKi.

In the timing diagram, the illustrated signals correspond to the preferred DCRM 100 of FIG. 1 as follows:

CLKi is the input clock signal;

CLKo is the output clock signal produced at the OR gate 160;

RSTN is a reset signal applied to the enable circuit 124, the first delay logic circuit 108, and the second delay logic circuit 110;

CLK1–6 are six delayed versions of CLKi as delayed by six of the plurality of delay elements 112A-n;

ENABLE is an enable signal at the enable terminal 122a of the counter 122;

COUNT is the achieved count presented at the output terminals 122c of the counter 122 and is used to control the first multiplexer 120;

SEL is the selection signal at the control terminal 130c of the second multiplexer 130;

MUX2 is a signal at the output terminal 130b of the second multiplexer 130;

DS1 and DS2 are the first and second delay signals produced by the first and second delay logic circuits 108, 110, respectively;

POS and NEG are the first and second clock signals generated by the first and second flip-flops 156, 158, respectively.

Initially, the DCRM 100 is reset by setting the value of RSTN low. When RSTN is low, ENABLE follows the input clock. RSTN is then set high until the next reset of the DCRM 100. After reset, the next time CLKi transitions from low to high, ENABLE goes high for one-half clock period of CLKi and then goes low until the next reset. During the one-half clock period when ENABLE is high, after reset, the counter 122 is enabled. ENABLE is high when CLKi is high and the output of the enable flip-flop 126 is low, thus producing a high value at the output terminal of the enable AND gate 128. ENABLE goes low when a falling edge of CLKi is received at the enable flip-flop 126 (i.e., after one-half clock period), which causes the output terminal 126d of the flip-flop 126 to go high, thereby producing a low state at the output terminal 128c of the enable AND gate 128. ENABLE remains low until the next time the DCRM 100 is reset.

When the counter 122 is enabled, COUNT, at the output terminals 122c of the counter 122, control the first multiplexer 120 to pass delayed versions of CLKi, i.e., CLK1–6. Initially, COUNT is 0, which prompts the first multiplexer 120 to pass CLKi as delayed by the first delay element 112A, i.e., CLKi. When the rising edge of CLK1 reaches the counter 122, the counter 122 increments COUNT by 1, thereby prompting the first multiplexer 120 to pass the second delayed version of CLKi, i.e., CLK2. The counter 122 continues to count rising edges of the delayed versions of CLKi and increment COUNT during the one-half period that the counter 122 is enabled.

SEL is COUNT divided by two using the divider 132. SEL controls the second multiplexer 130 to pass delayed versions of CLKi at the output terminal 130b, i.e., MUX2. For every two counts by the counter 122, SEL increments by 1, thus prompting the second multiplexer 130 to pass a new delayed version of CLKi for every two counts of the counter 122. Initially, when COUNT is 0, the second multiplexer 130 passes the delayed version of CLKi as delayed by the first delay element 112A, i.e., CLK1. After two counts of the counter 122, when COUNT is 2 the second multiplexer 130 passes the second delayed version of CLKi as delayed by the first delay element 112A and the second delay element 112B, i.e., CLK2. Finally, for the illustrated timing diagram, when the counter 122 reaches its final COUNT, the second multiplexer 130 passes the third delayed version of CLKi, i.e., CLK3. The second multiplexer 130 continues to pass CLK3 until the DCRM 100 is reset.

In the illustrated timing diagram, after reset, MUX2 goes high on the first rising edge of CLK1. The second multiplexer 130 is switched to select CLK2 after the first rising edge of CLK2 has already been received at the input terminals 130a of the second multiplexer 130. Likewise, the second multiplexer 130 is switched to select CLK3 after the first rising edge of CLK3 has already been received. Accordingly, during the initial setup of the second multiplexer 130, MUX2 will rise on the rising edge of CLK1 and fall on the falling edge of CLK3. Thereafter, MUX2 will follow CLK3.

DS1 is produced at the first delay logic circuit 108 by combining CLKi and MUX2 using a NAND logic gate 134. DS1 is supplied to the reset terminal 156d of the rising edge triggered flip-flop 156. When the DCRM 100 is reset, RSTN is set low, thereby causing the output terminal of the AND gate 136 to go low, which, in turn, resets the flip-flop 156. Thereafter, RSTN is set high so that the output of the AND gate 136 will follow the output of the NAND gate 134.

DS2 is produced at the second delay logic circuit 110 by combining CLKi and MUX2 using an OR logic gate 138. DS2 is supplied to the reset terminal 158d of the falling edge triggered flip-flop 158. When the DCRM 100 is reset, RSTN is set low, thereby causing the output terminal of the AND gate 140 to go low, which, in turn, resets the flip-flop 158. Thereafter, RSTN is set high so that the output of the AND gate 140 follows the output of the OR gate 138.

POS is set low during the reset of DCRM 100 by DS1. After reset, at every rising edge of CLKi, POS is set to the value at the input terminal 156a of the first signal generator 156, i.e. PWR (a high value). POS is then reset to a low value after every falling edge of DS1.

NEG is set low during the reset of DCRM 100 by DS2. After reset, at every falling edge of CLKi, NEG is set to the value at the input terminal 158a of the first signal generator 158, PWR (a high value). NEG is then reset to a low value after every falling edge of DS2.

POS and NEG are combined using the conventional OR gate 160 to produce CLKo.

Figure 3:
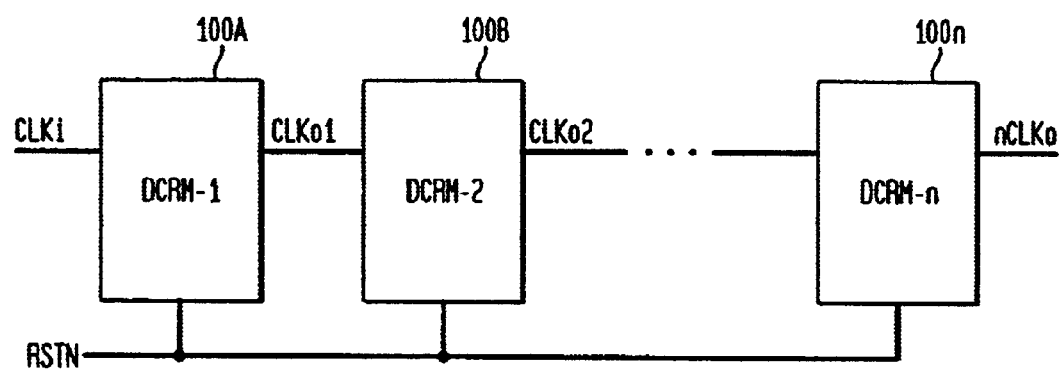
FIG. 3 is a block diagram of a plurality of digital clock rate multipliers connected in series in accordance with the present invention.

FIG. 3 depicts an alternative embodiment for increasing the multiplication of CLKi. In the embodiment depicted in FIG. 3, a plurality of DCRMs 100A-n are connected in series with the output from a first DCRM 100A feeding the input of the next DCRM 100B, etc. The output of the last DCRM 100n produces a n-multiplied output signal nCLKo, which is 2n times CLKi.

While, in the above description, a specific embodiment of the digital delay signal generator 102 is described, it is understood that the digital delay signal generator 102 can be any circuit that digitally develops at least two signals for controlling a clock circuit, such as clock circuit 104. Likewise, while a specific embodiment of the clock circuit 104 is described, it is understood that the clock circuit 104 can be any circuit that produces a multiplied output signal based on two or more digital signals.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method for multiplying an input signal comprising the steps of:
   digitally generating a first delay signal and a second delay signal based on the input signal;
   generating a first clock signal based on said first delay signal;
   generating a second clock signal based on said second delay signal; and
   combining said first and second clock signals to produce a multiplied output signal;
   wherein said step of digitally generating said first and second delay signals comprises as least the steps of:
      digitally generating a delayed clock signal based on the input signal; and
      logically combining said delayed clock signal and the input signal to produce said first delay signal.

2. The method of claim 1, wherein said combining step comprises at least the step of:
   ORing said first and second clock signals.

3. The method of claim 1:
   wherein said step of generating said first clock signal comprises at least the steps of:
      setting a first signal generator in response to rising edges of the input signal, and resetting said first signal generator in response to said first delay signal; and
   wherein said step of generating said first second clock signal comprises at least the steps of:
      setting a second signal generator in response to falling edges of the input signal, and resetting said second signal generator in response to said second delay signal.

4. The method of claim 1, wherein said step of digitally generating said first and second delay signals further comprises at least the step of:
   logically combining said delayed clock signal and the input signal to produce said second delay signal.

5. The method of claim 4, wherein the input clock has a period and further wherein said step of digitally generating said delayed clock signal comprises at least the step of:
   delaying the input signal by a predetermined amount of said period to produce said delayed clock signal.

6. The method of claim 4, wherein the input clock has a period and further wherein said step of digitally generating said delayed clock signal comprises at least the step of:
   delaying the input signal by a quarter of the period of the input clock to produce said delayed clock signal.

7. The method of claim 6, wherein said step of delaying the input signal by said quarter period of the input signal comprises at least the steps of:
   counting rising edges of delayed versions of the input signal during half the period of the input signal; and
   selecting one of said delayed versions as said delayed clock signal, said selected one of said delayed versions delayed by half the amount of delay of a last delayed version corresponding to the last rising edge counted.

8. The method of claim 4, wherein:
   said step of logically combining said delayed clock signal and the input clock signal to produce said first delay signal comprises at least the step of ANDing said delayed clock signal and the input clock signal; and
   said step of logically combining, said delayed clock signal and the input signal to produce said second delay signal comprises at least the step of ORing said delayed clock signal and the input signal.

9. A digital multiplier for multiplying an input signal comprising:
   a digital delay signal generator for generating a first delay signal and a second delay signal based on the input signal; and
   a clock circuit coupled to said digital delay signal generator for producing a multiplied output signal based at least partially on said first and second delay signals;
   wherein said digital signal generator comprises as least:
      a delay circuit having an input for receiving the input signal, said delay circuit producing a delayed clock signal at output based on the input signal; and
      a first delay logic circuit coupled to said delay circuit for combining the input signal and said delayed clock signal to produce said first delay signal.

10. The digital multiplier of claim 9, said clock circuit comprising at least:
    a first signal generator having a clock terminal for receiving the input signal, said first signal generator detecting rising edges of the input signal, said first signal generator further having a reset terminal for receiving said first delay signal and an output terminal for producing a first clock signal based on the input signal and said first delay signal;
    a second signal generator having a clock terminal for receiving the input signal, said second signal generator detecting falling edges of the input signal, said second signal generator further having a reset terminal for receiving said second delay signal and an output terminal for producing a second clock signal based on the input signal and said second delay signal; and
    a first logic circuit coupled to said first and second signal generators for combining said first and second clock signals to produce said multiplied output signal.

11. The digital multiplier of claim 9, said clock circuit comprising at least circuitry for combining said first and second delay signals to produce said multiplied output signal.

12. The digital multiplier of claim 11, said clock circuit comprising at least an OR logic gate for combining said first and second delay signals to produce said multiplied output signal.

13. The digital multiplier of claim 9, said digital signal generator further comprising at least:
- a second delay logic circuit coupled to said delay circuit for combining the input signal and said delayed clock signal to produce said second delay signal.

14. The multiplier of claim 13, said delay circuit comprising one or more delay elements connected in series, the input signal delayed by said one or more delay elements to produce said delayed clock signal.

15. The multiplier of claim 13, said delay circuit comprising:
- one or more delay elements connected in series, a first of said delay elements receiving the input signal;
- a first multiplexer coupled to said one or more delay elements having a plurality of inputs to receive the input clock signal as delayed by each of said delay elements, said first multiplexer further having a control terminal and an output terminal;
- a second multiplexer coupled to said one or more delay elements having a plurality of inputs to receive at least a portion of the input clock signals as delayed by each of said delay elements, said second multiplexer further having a control terminal and an output terminal;
- a counter having a clock terminal coupled to the output terminal of said first multiplexer and a count terminal coupled to the control terminal of said first multiplexer, said counter enabled during a first period of the input signal, said counter, when enabled, counting rising edges received from said first multiplexer, each time said counter counts a rising edge, said counter increments a count signal at said count terminal, thereby shifting said first multiplexer to pass the next delayed version of the input signal; and
- a divider coupled between the count terminal of said counter and the control terminal of said second multiplexer for dividing said count signal, thereby configuring said second multiplexer to pass said input signal delayed by a second period of the input signal to produce said delayed clock signal.

16. A digital delay circuit for delaying an input signal comprising:
- one or more delay elements connected in series, a first of said delay elements receiving the input signal;
- a first multiplexer coupled to said one or more delay elements having a plurality of input to receive the input signal as delayed by each of said delay elements, said first multiplexer further having a control terminal and an output terminal;
- a second multiplexer coupled to at least a portion of said one or more delay elements having a plurality of inputs to receive at least a portion of the input signals as delayed by each of said delay elements, said second multiplexer further having a control terminal and an output terminal;
- a counter having a clock terminal coupled to the output of said first multiplexer and a count terminal coupled to the control terminal of said first multiplexer, said counter enabled during a first period of the input signal, said counter, when enabled, counting rising edges received from said first multiplexer, each time said counter counts a rising edge, said counter increments a count signal at said count terminal, thereby shifting said first multiplexer to pass the next delayed version of the input signal; and
- a divider coupled between the count terminal of said counter and the control terminal of said second multiplexer for dividing said count signal, thereby configuring said second multiplexer to pass said input signal delayed by a second period of the input signal to produce a delayed clock signal.

17. The delay circuit of claim 16, said first period being one-half period of the input signal and said second period being one-quarter period of the input signal.

18. A method for delaying an input signal comprising the steps of:
- producing a plurality of delayed versions of the input signal;
- enabling a counter for a period of the input signal;
- counting specified edges of said plurality of delayed version when said counter is enabled; and
- selecting a delayed output signal from said plurality of delayed versions based on the number of specified edges counted.

19. The method of claim 18, wherein said counter in enabled for one-half period of the input signal.

20. The method of claim 18, wherein said selecting step comprises at least the steps of:
- determining half said number of specified edges counted; and
- selecting said delayed version corresponding to said determined number.

* * * * *